(12) United States Patent
Chen et al.

(10) Patent No.: US 11,575,125 B2
(45) Date of Patent: Feb. 7, 2023

(54) PATTERNED ANODE FOR LITHIUM-ION BATTERIES

(71) Applicant: UChicago Argonne, LLC, Chicago, IL (US)

(72) Inventors: Zonghai Chen, Bolingbrook, IL (US); Khalil Amine, Oakbrook, IL (US); Rachid Amine, Lemont, IL (US); Ali Abouimrane, Lemont, IL (US); Ozgul Keles, Istanbul (TR); Billur Deniz Karahan, Istanbul (TR); Osman Levent Eryilmaz, Plainfield, IL (US)

(73) Assignee: UChicago Argonne, LLC, Chicago, IL (US)

( * ) Notice: Subject to any disclaimer, the term of this patent is extended or adjusted under 35 U.S.C. 154(b) by 211 days.

(21) Appl. No.: 16/268,208

(22) Filed: Feb. 5, 2019

(65) Prior Publication Data
US 2020/0251725 A1    Aug. 6, 2020

(51) Int. Cl.
| H01M 4/36 | (2006.01) |
| H01M 10/0525 | (2010.01) |
| H01M 4/04 | (2006.01) |
| H01M 4/134 | (2010.01) |
| H01M 4/1395 | (2010.01) |
| H01M 4/62 | (2006.01) |
| H01M 4/66 | (2006.01) |
| C23C 14/16 | (2006.01) |
| C23C 14/35 | (2006.01) |
| H01M 4/38 | (2006.01) |
| H01M 4/02 | (2006.01) |

(52) U.S. Cl.
CPC .......... *H01M 4/366* (2013.01); *C23C 14/165* (2013.01); *C23C 14/352* (2013.01); *H01M 4/0426* (2013.01); *H01M 4/0428* (2013.01); *H01M 4/134* (2013.01); *H01M 4/1395* (2013.01); *H01M 4/386* (2013.01); *H01M 4/628* (2013.01); *H01M 4/661* (2013.01); *H01M 10/0525* (2013.01); *H01M 2004/027* (2013.01)

(58) Field of Classification Search
CPC ............. H01M 10/0525; H01M 4/386; H01M 4/1395; H01M 4/134; H01M 4/0428; H01M 4/366
See application file for complete search history.

(56) References Cited

U.S. PATENT DOCUMENTS

| 2005/0019670 A1 | 1/2005 | Amine et al. | |
| 2012/0315543 A1* | 12/2012 | Wata | H01M 4/38 429/217 |
| 2014/0099539 A1* | 4/2014 | Yamazaki | C01B 33/113 429/211 |

(Continued)

OTHER PUBLICATIONS

Gao, et al., "Parasitic Reactions in Nanosized Silicon Anodes for Lithium-Ion Batteries," Nano. Lett., Feb. 8, 2017, vol. 17, No. 3, pp. 1512-1519 (abstract).

*Primary Examiner* — Jonathan G Jelsma
(74) *Attorney, Agent, or Firm* — Foley & Lardner LLP

(57) ABSTRACT

Anodic materials for lithium ions batteries include a current collector and a superlattice disposed on at least a portion of the current collector, the superlattice comprising: alternating layers of an anode active material and an anode inactive material; and a plurality of channels that extend from the current collector through the alternating layers of anode active material and anode inactive material.

22 Claims, 6 Drawing Sheets

(56) References Cited

U.S. PATENT DOCUMENTS

2014/0212735 A1* 7/2014 Li .................. H01M 4/0428
429/162
2016/0020035 A1* 1/2016 Inoue ................ H01M 4/366
429/219

* cited by examiner

PATTERNED ANODE FOR LITHIUM-ION BATTERIES

GOVERNMENT RIGHTS

This invention was made with government support under Contract No. DE-AC02-06CH11357 awarded by the United States Department of Energy to UChicago Argonne, LLC, operator of Argonne National Laboratory. The government has certain rights in the invention.

FIELD OF INVENTION

The present technology relates generally to lithium rechargeable batteries. More particularly, the present technology relates to an anode for a lithium ion battery, and methods for making the anode.

BACKGROUND

The following description of the background of the present technology is provided simply as an aid in understanding the present technology and is not admitted to describe or constitute prior art to the present technology.

Lithium-ion batteries are classes of electrochemical energy storage devices that comprise a cathode (positive electrode), an anode (negative electrode), and an electrolyte filling the space between the electrically insulated cathode and anode. In general, a porous separator is used to electrically separate the cathode from the anode. The electrolyte typically comprises a lithium salt dissolved in a non-aqueous (aprotic) organic solvent, which may be a linear carbonates, such as ethyl methyl carbonate, or a cyclic carbonate, like ethylene carbonate.

Lithium-ion batteries are widely used pursued as energy storage devices for portable electronics, as well as electric vehicles, due to their high energy density. In traditional lithium-ion batteries, graphitic materials are the dominant negative electrode materials as the intercalation host for lithium ions. Typically, this class of materials can deliver a theoretical specific capacity of about 372 mAh/g. Alternatively, metallic and intermetallic host materials such Si, Sn, Zn based materials have attracted substantial R&D attention as they can deliver a very high theoretical reversible capacity (up to 3800 mAh/g for Si). The disadvantages for these types of materials is the high volumetric changes that can occur upon cycling (up to 300%). This dramatic volumetric change of the active materials challenges the mechanical integrity of the laminated electrode, and ultimately causes cracking and failure of the electrode. It has been demonstrated that the cracking of particles can be effectively suppressed by limiting the length of at least one dimension of the electrode material to 150 nm or less. This discovery gave rise to a new class of nanostructured electrodes including, but not limited to, nano thin films, nanofibers, nano rods, nano spheres, and nanoparticles, which all display improved electrochemical performance. However, the technical drawbacks of such nano-structured materials include: (1) a high cost to synthesize the material, (2) a low loading density of electrode laminate, (3) a large initial irreversible capacity loss, and (4) a significant increase on the specific surface area to promote the parasitic reactions between the electrolyte and the intermetallic alloys (see Chen, Z. et al. *ACS Nano Lett* 17:1512-1519 (2017)).

It is therefore of great interest to the battery industry to identify electrochemical systems and anodic materials that overcome the drawbacks of nano-structured materials for applications in high-energy density lithium-ion batteries.

SUMMARY

In one aspect, the present disclosure provides for an anode for a lithium ion battery that includes a current collector and a superlattice disposed on at least a portion of the current collector; the superlattice comprising alternating layers of an anode active material and an anode inactive material, and a plurality of channels that extend from the current collector through the alternating layers of anode active material and anode inactive material.

In some embodiments, the current collector includes copper, stainless steel, titanium, tantalum, platinum, gold, aluminum, nickel, cobalt, cobalt nickel alloy, highly alloyed ferritic stainless steel containing molybdenum and chromium, a nickel-containing alloy, a chromium-containing alloy, or a molybdenum-containing alloy. In some embodiments, the current collector includes a foil.

In some embodiments, the superlattice has a thickness of about 5 nm to about 5 μm.

In some embodiments, each of the plurality of alternating layers of the anode active material and the anode inactive material individually has a thickness of about 0.1 nm to about 150 nm.

In some embodiments, the anode active material includes Si, Zn, Sn, As, Sb, P, Cd, In, Mg, Ge, Al, S, Na, K, C, an oxide thereof, or a combination of any two or more thereof. In some embodiments, the anode active material includes Si.

In some embodiments, the superlattice includes about 5 wt % to about 95 wt % anode active material.

In some embodiments, the plurality of alternating layers of an anode active material include a nanocrystalline structure.

In some embodiments, the plurality of alternating layers of an anode active material include an amorphous structure.

In some embodiments, the anode inactive material includes Cu, Mo, Bi, Ni, Fe, Ti, V, C, Mn, Co, Ni, Ru, Rh, Ag, Au, Pd, W, Y, Sc, Zr, Nb, Hf, Ta, an oxide thereof, or a combination of any two or more thereof. In some embodiments, the anode inactive material comprises an intermetallic material of any two or more of Cu, Mo, Bi, Ni, Fe, Ti, V, C, Mn, Co, Ni, Tc, Ru, Rh, Ag, Au, Pd, W, Y, Sc, Zr, Nb, Hf, Ta, or an oxide thereof, or a combination of any two or more thereof. In some embodiments, the intermetallic material includes CuMo.

In some embodiments, the superlattice includes about 95 wt % to about 5 wt % anode inactive material.

In some embodiments, the plurality of channels has a width of about 0.1 nm to about 10 nm.

In some embodiments, the plurality of channels allow diffusion of a non-aqueous electrolyte.

In another aspect, the present disclosure provides a method for making an anode for a lithium ion battery, wherein the method includes providing a current collector and depositing alternating layers of an anode active material and an anode inactive material to form a superlattice; wherein the superlattice is disposed on at least a portion of the current collector.

In some embodiments, the superlattice is deposited using a physical vapor deposition method. In some embodiments, the physical vapor deposition method comprises magnetron sputtering or electron beam evaporation. In some embodiments, the physical vapor deposition method comprises the current collector configured to be disposed on a rotating table. In some embodiments, the physical vapor deposition method comprises at least one target for the anode active material. In some embodiments, the physical vapor deposition method comprises at least one target for the anode inactive material. In some embodiments, the alternating layers of the anode active material and the anode inactive material are deposited discontinuously to form a plurality of channels. In some embodiments, the plurality of channels extends from the current collector through the alternating layers of anode active material and anode inactive material. In some embodiments, a plurality of channels are cut and/or etched into the superlattice after forming the superlattice on the current collector. In some embodiments, the plurality of channels extends from the current collector through the alternating layers of anode active material and anode inactive material.

In another aspect, the present disclosure provides a lithium ion battery that includes a non-aqueous electrolyte, a cathode, and an anode; wherein the anode includes a current collector and a superlattice disposed on at least a portion of the current collector; the superlattice comprising alternating layers of an anode active material and an anode inactive material, and a plurality of channels that extend from the current collector through the alternating layers of anode active material and anode inactive material.

DETAILED DESCRIPTION

Figure 1:
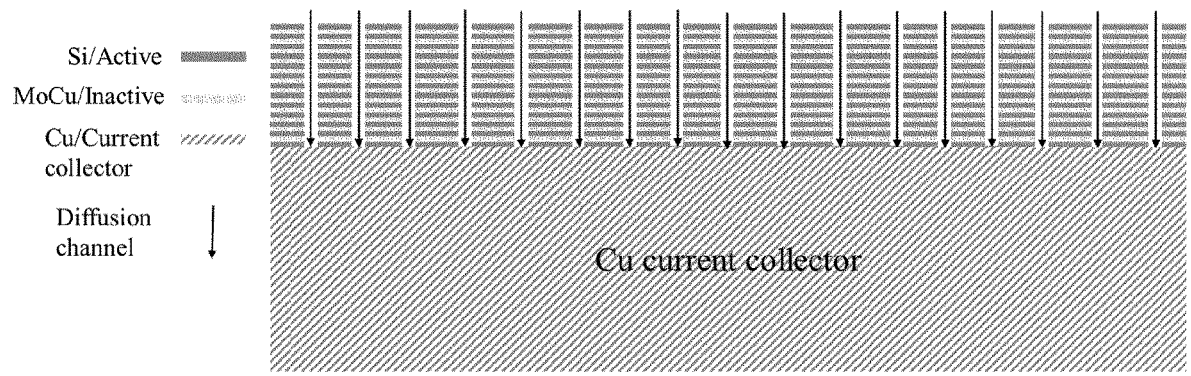
FIG. 1 is a non-limiting, diagrammatic representation of an embodiment of the anode of the present technology.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

The definitions of certain terms as used in this specification are provided below. Unless defined otherwise, all technical and scientific terms used herein generally have the same meaning as commonly understood by one of ordinary skill in the art to which this present technology belongs.

The following terms are used throughout as defined below.

As used herein and in the appended claims, singular articles such as "a", "an", and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

As used herein, the terms "contain", "contains", or "containing" in the context of describing the elements (especially in the context of the following claims) are to be construed as comprising or including the elements being described herein.

In general, "substituted" refers to an alkyl, alkenyl, alkynyl, aryl, or ether group, as defined below (e.g., an alkyl group) in which one or more bonds to a hydrogen atom contained therein are replaced by a bond to non-hydrogen or non-carbon atoms. Substituted groups also include groups in which one or more bonds to a carbon(s) or hydrogen(s) atom are replaced by one or more bonds, including double or triple bonds, to a heteroatom. Thus, a substituted group will be substituted with one or more substituents, unless otherwise specified. In some embodiments, a substituted group is substituted with 1, 2, 3, 4, 5, or 6 substituents. Examples of substituent groups include: halogens (i.e., F, Cl, Br, and I); hydroxyls; alkoxy, alkenoxy, alkynoxy, aryloxy, aralkyloxy, heterocyclyloxy, and heterocyclylalkoxy groups; carbonyls (oxo); carboxyls; esters; urethanes; oximes; hydroxylamines; alkoxyamines; aralkoxyamines; thiols; sulfides; sulfoxides; sulfones; sulfonyls; sulfonamides; amines; N-oxides; hydrazines; hydrazides; hydrazones; azides; amides; ureas; amidines; guanidines; enamines; imides; isocyanates; isothiocyanates; cyanates; thiocyanates; imines; nitro groups; nitriles (i.e., CN); and the like.

As used herein, "alkyl" groups include straight chain and branched alkyl groups having from 1 to about 20 carbon atoms, and typically from 1 to 12 carbons or, in some embodiments, from 1 to 8 carbon atoms. As employed herein, "alkyl groups" include cycloalkyl groups as defined below. Alkyl groups may be substituted or unsubstituted. Examples of straight chain alkyl groups include methyl, ethyl, n-propyl, n-butyl, n-pentyl, n-hexyl, n-heptyl, and n-octyl groups. Examples of branched alkyl groups include, but are not limited to, isopropyl, sec-butyl, t-butyl, neopentyl, and isopentyl groups. Representative substituted alkyl groups may be substituted one or more times with, for example, amino, thio, hydroxy, cyano, alkoxy, and/or halo groups such as F, Cl, Br, and I groups. As used herein the term haloalkyl is an alkyl group having one or more halo groups. In some embodiments, haloalkyl refers to a per-haloalkyl group.

Cycloalkyl groups are cyclic alkyl groups such as, but not limited to, cyclopropyl, cyclobutyl, cyclopentyl, cyclohexyl, cycloheptyl, and cyclooctyl groups. In some embodiments, the cycloalkyl group has 3 to 8 ring members, whereas in other embodiments the number of ring carbon atoms range from 3 to 5, 6, or 7. Cycloalkyl groups may be substituted or unsubstituted. Cycloalkyl groups further include polycyclic cycloalkyl groups such as, but not limited to, norbornyl, adamantyl, bornyl, camphenyl, isocamphenyl, and carenyl groups, and fused rings such as, but not limited to, decalinyl, and the like. Cycloalkyl groups also include rings that are substituted with straight or branched chain alkyl groups as defined above. Representative substituted cycloalkyl groups may be mono-substituted or substituted more than once, such as, but not limited to: 2,2-; 2,3-; 2,4-; 2,5-; or 2,6-disubstituted cyclohexyl groups or mono-, di-, or tri-substituted norbornyl or cycloheptyl groups, which may be substituted with, for example, alkyl, alkoxy, amino, thio, hydroxy, cyano, and/or halo groups.

Alkenyl groups are straight chain, branched or cyclic alkyl groups having 2 to about 20 carbon atoms, and further including at least one double bond. In some embodiments alkenyl groups have from 1 to 12 carbons, or, typically, from 1 to 8 carbon atoms. Alkenyl groups may be substituted or unsubstituted. Alkenyl groups include, for instance, vinyl, propenyl, 2-butenyl, 3-butenyl, isobutenyl, cyclohexenyl, cyclopentenyl, cyclohexadienyl, butadienyl, pentadienyl, and hexadienyl groups among others. Alkenyl groups may be substituted similarly to alkyl groups. Divalent alkenyl groups, i.e., alkenyl groups with two points of attachment, include, but are not limited to, CH—CH=CH$_2$, C=CH$_2$, or C=CHCH$_3$.

As used herein, "aryl", or "aromatic," groups are cyclic aromatic hydrocarbons that do not contain heteroatoms. Aryl groups include monocyclic, bicyclic and polycyclic ring systems. Thus, aryl groups include, but are not limited to, phenyl, azulenyl, heptalenyl, biphenylenyl, indacenyl, fluorenyl, phenanthrenyl, triphenylenyl, pyrenyl, naphthacenyl, chrysenyl, biphenyl, anthracenyl, indenyl, indanyl, pentalenyl, and naphthyl groups. In some embodiments, aryl groups contain 6-14 carbons, and in others from 6 to 12 or even 6-10 carbon atoms in the ring portions of the groups. The phrase "aryl groups" includes groups containing fused rings, such as fused aromatic-aliphatic ring systems (e.g., indanyl, tetrahydronaphthyl, and the like). Aryl groups may be substituted or unsubstituted.

Provided herein are electrochemical cells that are based upon a superlattice nanostructured anode that improve upon cycling stability in such cells when compared to electrochemical cells having conventional anodes. The anodes include alternating thin film layers of active material and inactive material, and have a plurality of small channels to allow for the electrolyte to deliver lithium ions to the layers of active material within the superlattice. The active material may include Si and the inactive material may include an intermetallic composition of copper and molybdenum. The inactive material may act as a rigid skeleton for the electrode and provide integrity to the anode by mechanically tolerating the destructive effect of the volumetric changes induced by Si atoms upon cycling. The alternating layers of active and inactive material in the superlattice advantageously improve the electrochemical performance of the electrode by minimizing and/or eliminating pulverization and unstable SEI formation, and suppressing the formation of crystalline Li$_{15}$Si$_4$ (c-Li$_{15}$Si$_4$) upon deep lithiation. Moreover, the anodes of the present technology reduce the exposed surface area of the Si active material to the electrolyte by intercalating the active layer between two inactive material layers. Accordingly, the anodes of the present technology are expected to undergo a slower parasitic reaction than conventional Si based anodes.

In one aspect, an anode is provided for a lithium ion battery. The anodes include a current collector and a superlattice. The superlattice is configured to be disposed on at least a portion of the current collector, and the superlattice includes alternating layers of an anode active material and an anode inactive material. The superlattice may further include a plurality of channels that extend from the current collector through the alternating layers of anode active material and anode inactive material. FIG. 1 is one illustration that is representative of an anode as described herein.

In any embodiment disclosed herein, the current collector may include copper, stainless steel, titanium, tantalum, platinum, gold, aluminum, nickel, cobalt, cobalt nickel alloy, highly alloyed ferritic stainless steel containing molybdenum and chromium, a nickel-containing alloy, a chromium-containing alloy, or a molybdenum-containing alloy. Additionally, or alternatively, in some embodiments, the current collector is a foil.

The superlattice may have a thickness of about 5 nm to about 5 µm. This may include, for example, a thickness of about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 22 nm, about 24 nm, about 26 nm, about 28 nm, about 30 nm, about 32 nm, about 34 nm, about 36 nm, about 38 nm, about 40 nm, about 42 nm, about 44 nm, about 46 nm, about 48 nm, about 50 nm, about 52 nm, about 54 nm, about 56 nm, about 58 nm, about 60 nm, about 62 nm, about 64 nm, about 66 nm, about 68 nm, about 70 nm, about 72 nm, about 74 nm, about 76 nm, about 78 nm, about 80 nm, about 82 nm, about 84 nm, about 86 nm, about 88 nm, about 90 nm, about 92 nm, about 94 nm, about 96 nm, about 98 nm, about 100 nm, about 110 nm, about 120 nm, about 130 nm, about 140 nm, about 150 nm, about 160 nm, about 170 nm, about 180 nm, about 190 nm, about 200 nm, about 220 nm, about 240 nm, about 260 nm, about 280 nm, about 300 nm, about 320 nm, about 340 nm, about 360 nm, about 380 nm, about 400 nm, about 420 nm, about 440 nm, about 460 nm, about 480 nm, about 500 nm, about 550 nm, about 600 nm, about 650 nm, about 700 nm, about 750 nm, about 800 nm, about 850 nm, about 900 nm, about 950 nm, about 1000 nm, about 1 µm, about 1.1 µm, about 1.2 µm, about 1.3 µm, about 1.4 µm, about 1.5 µm, about 1.6 µm, about 1.7 µm, about 1.8 µm, about 1.9 µm, about 2 µm, about 2.2 µm, about 2.4 µm, about 2.6 µm, about 2.8 µm, about 3 µm, about 3.2 µm, about 3.4 µm, about 3.6 µm, about 3.8 µm, about 4 µm, about 4.2 µm, about 4.4 µm, about 4.6 µm, about 4.8 µm, about 5 µm, or any range including and/or in between any two of the preceding values.

Each of the plurality of alternating layers of the anode active material and the anode inactive material individually may have a thickness of about 0.1 nm to about 150 nm. This may include, for example, a thickness of about 0.1 nm, about 0.2 nm, about 0.3 nm, about 0.4 nm, about 0.5 nm, about 0.6 nm, about 0.7 nm, about 0.8 nm, about 0.9 nm, about 1 nm, about 1.1 nm, about 1.2 nm, about 1.3 nm, about 1.4 nm, about 1.5 nm, about 1.6 nm, about 1.7 nm, about 1.8 nm, about 1.9 nm, about 2 nm, about 2.2 nm, about 2.4 nm, about 2.6 nm, about 2.8 nm, about 3 nm, about 3.2 nm, about 3.4 nm, about 3.6 nm, about 3.8 nm, about 4 nm, about 4.2 nm, about 4.4 nm, about 4.6 nm, about 4.8 nm, about 5 nm, about 5.5 nm, about 6 nm, about 6.5 nm, about 7 nm, about 7.5 nm, about 8 nm, about 8.5 nm, about 9 nm, about 9.5 nm, about 10 nm, about 11 nm, about 12 nm, about 13 nm, about 14 nm, about 15 nm, about 16 nm, about 17 nm, about 18 nm, about 19 nm, about 20 nm, about 22 nm, about 24 nm, about 26 nm, about 28 nm, about 30 nm, about 32 nm, about 34 nm, about 36 nm, about 38 nm, about 40 nm, about 42 nm, about 44 nm, about 46 nm, about 48 nm, about 50 nm, about 55 nm, about 60 nm, about 65 nm, about 70 nm, about 75 nm, about 80 nm, about 85 nm, about 90 nm, about 95 nm, about 100 nm, about 110 nm, about 120 nm, about 130 nm, about 140 nm, about 150 nm, or any range including and/or in between any two of the preceding values.

The anode active material may include Si, Zn, Sn, As, Sb, P, Cd, In, Mg, Ge, Al, S, Na, K, C, an oxide thereof, or a combination of any two or more thereof. In some embodiments, the anode active material may include Si.

The superlattice may include about 5 wt % to about 95 wt % anode active material. This may include, for example, about 5 wt %, about 5.2 wt %, about 5.4 wt %, about 5.6 wt %, about 5.8 wt %, about 6 wt %, about 6.2 wt %, about 6.4 wt %, about 6.6 wt %, about 6.8 wt %, about 7 wt %, about 7.2 wt %, about 7.4 wt %, about 7.6 wt %, about 7.8 wt %, about 8 wt %, about 8.2 wt %, about 8.4 wt %, about 8.6 wt %, about 8.8 wt %, about 9 wt %, about 9.2 wt %, about 9.4 wt %, about 9.6 wt %, about 9.8 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 22 wt %, about 24 wt %, about 26 wt %, about 28 wt %, about 30 wt %, about 32 wt %, about 34 wt %, about 36 wt %, about 38 wt %, about 40 wt %, about 42 wt %, about 44 wt %, about 46 wt %, about 48 wt %, about 50 wt %, about 52 wt %, about 54 wt %, about 56 wt %, about 58 wt %, about 60 wt %, about 62 wt %, about 64 wt %, about 66 wt %, about 68 wt %, about 70 wt %, about 72 wt %, about 74 wt %, about 76 wt %, about 78 wt %, about 80 wt %, about 82 wt %, about 84 wt %, about 86 wt %, about 88 wt %, about 90 wt %, about 92 wt %, about 94 wt %, about 95 wt %, or any range including and/or in between any two of the preceding values, anode active material.

In any embodiment disclosed herein, the plurality of alternating layers of an anode active material may include a nanocrystalline structure. In some embodiments, the plurality of alternating layers of an anode active material may include an amorphous structure.

In any embodiment disclosed herein, the anode inactive material includes Cu, Mo, Bi, Ni, Fe, Ti, V, C, Mn, Co, Ni, Ru, Rh, Ag, Au, Pd, W, Y, Sc, Zr, Nb, Hf, Ta, an oxide thereof, or a combination of any two or more thereof.

In any embodiment disclosed herein, the anode inactive material includes an intermetallic material of any two or more of Cu, Mo, Bi, Ni, Fe, Ti, V, C, Mn, Co, Ni, Tc, Ru, Rh, Ag, Au, Pd, W, Y, Sc, Zr, Nb, Hf, Ta, or an oxide thereof. In some embodiments, the intermetallic material includes Cu and Mo.

In any embodiment disclosed herein, the superlattice may include about 95 wt % to about 5 wt % anode inactive material. This may include, for example, about 95 wt %, about 94 wt %, about 92 wt %, about 90 wt %, about 88 wt %, about 86 wt %, about 84 wt %, about 82 wt %, about 80 wt %, about 78 wt %, about 76 wt %, about 74 wt %, about 72 wt %, about 70 wt %, about 68 wt %, about 66 wt %, about 64 wt %, about 62 wt %, about 60 wt %, about 58 wt %, about 56 wt %, about 54 wt %, about 52 wt %, about 50 wt %, about 48 wt %, about 46 wt %, about 44 wt %, about 42 wt %, about 40 wt %, about 38 wt %, about 36 wt %, about 34 wt %, about 32 wt %, about 30 wt %, about 28 wt %, about 26 wt %, about 24 wt %, about 22 wt %, about 20 wt %, about 19 wt %, about 18 wt %, about 17 wt %, about 16 wt %, about 15 wt %, about 14 wt %, about 13 wt %, about 12 wt %, about 11 wt %, about 10 wt %, about 9.8 wt %, about 9.6 wt %, about 9.4 wt %, about 9.2 wt %, about 9 wt %, about 8.8 wt %, about 8.6 wt %, about 8.4 wt %, about 8.2 wt %, about 8 wt %, about 7.8 wt %, about 7.6 wt %, about 7.4 wt %, about 7.6 wt %, about 7.4 wt %, about 7.2 wt %, about 7 wt %, about 6.8 wt %, about 6.6 wt %, about 6.4 wt %, about 6.2 wt %, about 6 wt %, about 5.8 wt %, about 5.6 wt %, about 5.4 wt %, about 5.2 wt %, about 5 wt %, or any range including and/or in between any two of the preceding values, anode inactive material.

As noted above, the superlattice may include a plurality of channels that extend from the current collector through the alternating layers of anode active material and anode inactive material. In any embodiment disclosed herein, the plurality of channels may each have a width of about 0.1 nm to about 10 nm. This may include, for example, a width of about 0.1 nm, about 0.15 nm, about 0.2 nm, about 0.25 nm, about 0.3 nm, about 0.35 nm, about 0.4 nm, about 0.45 nm, about 0.5 nm, about 0.55 nm, about 0.6 nm, about 0.65 nm, about 0.7 nm, about 0.75 nm, about 0.8 nm, about 0.85 nm, about 0.9 nm, about 0.95 nm, about 1 nm, about 1.1 nm, about 1.2 nm, about 1.3 nm, about 1.4 nm, about 1.5 nm, about 1.6 nm, about 1.7 nm, about 1.8 nm, about 1.9 nm, about 2 nm, about 2.2 nm, about 2.4 nm, about 2.6 nm, about 2.8 nm, about 3 nm, about 3.2 nm, about 3.4 nm, about 3.6 nm, about 3.8 nm, about 4 nm, about 4.2 nm, about 4.4 nm, about 4.6 nm, about 4.8 nm, about 5 nm, about 5.2 nm, about 5.4 nm, about 5.6 nm, about 5.8 nm, about 6 nm, about 6.2 nm, about 6.4 nm, about 6.6 nm, about 6.8 nm, about 7 nm, about 7.2 nm, about 7.4 nm, about 7.6 nm, about 7.8 nm, about 8 nm, about 8.2 nm, about 8.4 nm, about 8.6 nm, about 8.8 nm, about 9 nm, about 9.2 nm, about 9.4 nm, about 9.6 nm, about 9.8 nm, about 10 nm, or any range including and/or in between any two of the preceding values.

The superlattice may further include a polymeric binder. Illustrative binders may include, but are not limited to, polyvinylidene difluoride (PVDF), poly(acrylic acid) (PAA), lithiated PAA, polyimide (PI), polyacrylonitrile (PAN), styrene-butadiene rubber (SBR), carboxymethyl cellulose (CMC), or a combination of any two or more thereof.

In any embodiment disclosed herein, the anode may exhibit a specific capacity of about 1650 mAh/g to about 1750 mAh/g. This may include, for example, a specific capacity of about 1650 mAh/g, about 1655 mAh/g, about 1660 mAh/g, about 1665 mAh/g, about 1670 mAh/g, about 1675 mAh/g, about 1680 mAh/g, about 1685 mAh/g, about 1690 mAh/g, about 1695 mAh/g, about 1700 mAh/g, about 1705 mAh/g, about 1710 mAh/g, about 1715 mAh/g, about 1720 mAh/g, about 1725 mAh/g, about 1730 mAh/g, about 1735 mAh/g, about 1740 mAh/g, about 1745 mAh/g, about 1750 mAh/g, or any range including and/or in between any two of the preceding values.

In another aspect, the present disclosure is directed to a lithium ion battery that includes a non-aqueous electrolyte, a cathode, and any of the anodes disclosed herein.

The non-aqueous electrolyte may include an aprotic solvent and a metal salt. In some embodiments, the non-aqueous electrolyte may include an alkali metal salt. In some embodiments, the alkali metal salt may be a lithium salt or a sodium salt. Where a non-aqueous electrolyte is used, the non-aqueous electrolyte includes a polar aprotic solvent and a lithium metal salt. A variety of solvents may be employed in the electrolyte as the polar aprotic solvent. The electrolytes are substantially non-aqueous. As used herein, the term "substantially non-aqueous" means that the electrolytes do not contain water, or if water is present, it is only present at trace levels. For example, where the water is present at trace levels it is present at less than 20 ppm.

In any embodiment disclosed herein, the polar aprotic solvent may include liquids and gels capable of solubilizing sufficient quantities of the lithium salt and a redox shuttle so that a suitable quantity of charge can be transported from the positive electrode to negative electrode. In some embodiments, the solvents may be used over a wide temperature range, e.g., from about −30° C. to about 70° C. without freezing or boiling, and are stable in the electrochemical range within which the cell electrodes and shuttle operate. In some embodiments, the solvents may be used over a wide temperature range, e.g., from about −30° C., about −28° C., about −26° C., about −24° C., about −22° C., about −20° C., about −19° C., about −18° C., about −17° C., about −16° C., about −15° C., about −14° C., about −13° C., about −12° C., about −11° C., about −10° C., about −9° C., about −8° C., about −7° C., about −6° C., about −5° C., about −4° C., about −3° C., about −2° C., about −1° C., about 0° C., about 1° C., about 2° C., about 3° C., about 4° C., about 5° C., about 6° C., about 7° C., about 8° C., about 9° C., about 10° C., about 11° C., about 12° C., about 13° C., about 14° C., about 15° C., about 16° C., about 17° C., about 18° C., about 19° C., about 20° C., about 22° C., about 24° C., about 26° C., about 28° C., about 30° C., about 32° C., about 34° C., about 36° C., about 38° C., about 40° C., about 42° C., about 44° C., about 46° C., about 48° C., about 50° C., about 52° C., about 54° C., about 56° C., about 58° C., about 60° C., about 62° C., about 64° C., about 66° C., about 68° C., about 70° C., 6° C., about 6° C., or any range including and/or in between any two of the preceding values, without freezing or boiling, and are stable in the electrochemical range within which the cell electrodes and shuttle operate.

Illustrative solvents include, but are not limited to, ethylene carbonate, dimethyl carbonate, ethyl methyl carbonate, diethyl carbonate, methyl propyl carbonate, ethyl propyl carbonate, dipropyl carbonate, propylene carbonate, fluoroethylene carbonate, bis(trifluoroethyl) carbonate, bis(pentafluoropropyl) carbonate, trifluoroethyl methyl carbonate, pentafluoroethyl methyl carbonate, heptafluoropropyl methyl carbonate, perfluorobutyl methyl carbonate, trifluoroethyl ethyl carbonate, pentafluoroethyl ethyl carbonate, heptafluoropropyl ethyl carbonate, perfluorobutyl ethyl carbonate, dioloxane, fluorinated oligomers, dimethoxyethane, a glyme, triglyme, dimethylvinylene carbonate, tetraethyleneglycol, dimethyl ether, polyethylene glycols, sulfones, γ-butyrolactone, δ-butyrolactone, a silane, a siloxane, siloxane N-methyl acetamide, acetonitrile, an acetal, a ketal, an ester, a carbonate, a sulfone, a sulfite, a sulfolane, an aliphatic ether, a cyclic ether, a polyether, a phosphate ester, an N-alkylpyrrolidone, adiponitrile, or a combination of any two or more thereof. In some embodiments, a fluorinated derivative of any solvent disclosed herein may be used.

Suitable salts for the electrolyte may include, but are not limited to, lithium alkyl fluorophosphates; lithium alkyl fluoroborates; lithium 4,5-dicyano-2-(trifluoromethyl)imidazole; lithium 4,5-dicyano-2-methylimidazole; trilithium 2,2',2"-tris(trifluoromethyl)benzotris(imidazolate); $Li(CF_3CO_2)$; $Li(C_2F_5CO_2)$; $LiCF_3SO_3$; $LiCH_3SO_3$; $LiN(SO_2CF_3)_2$; $LiC(CF_3SO_2)_3$; $LiN(SO_2C_2F_5)_2$; $LiClO_4$; $LiBF_4$; $LiAsF_6$; $LiPF_6$; $LiPF_2(C_2O_4)_2$; $LiPF_4(C_2O_4)$; $LiB(C_2O_4)_2$; $LiBF_2(C_2O_4)_2$; $Li_2(B_{12}X_{12-I}H_I)$; $Li_2(B_{10}X_{10-I'}H_{I'})$; $LiAlF_4$; $Li(FSO_2)_2N$; $Li_2SO_4$; $Na_2SO_4$; $NaPF_6$; $NaClO_4$; $LiAlO_2$; $LiSCN$; $LiBr$; $LiI$; $LiAsF_6$; $LiB(Ph)_4$; $Li_2S_{n''}$; $Li_2Se_{n''}$; $(LiS_{n''}R)_y$; $(LiSe_{n''}R)_y$; or a combination of any two or more thereof; wherein X is independently at each occurrence a halogen, I is independently at each occurrence an integer from 0 to 12, I' is independently at each occurrence an integer from 0 to 10, n" is independently at each occurrence an integer from 1 to 20, y is independently at each occurrence an integer from 1 to 3, and R is independently at each occurrence H, alkyl, alkenyl, aryl, ether, F, $CF_3$, $COCF_3$, $SO_2CF_3$, or $SO_2F$.

In any embodiment disclosed herein, the salt may be present in the electrolyte at a concentration from about 0.5M to about 2M. This may include, for example, from about 0.5M, about 0.52M, about 0.54M, about 0.56M, about 0.58M, about 0.6M, about 0.62M, about 0.64M, about 0.66M, about 0.68M, about 0.7M, about 0.72M, about 0.74M, about 0.76M, about 0.78M, about 0.8M, about 0.82M, about 0.84M, about 0.86M, about 0.88M, about 0.9M, about 0.92M, about 0.94M, about 0.96M, about 0.98M, about 1M, about 1.02M, about 1.04M, about 1.06M, about 1.08M, about 1.1M, about 1.12M, about 1.14M, about 1.16M, about 1.18M, about 1.2M, about 1.22M, about 1.24M, about 1.26M, about 1.28M, about 1.3M, about 1.32M, about 1.34M, about 1.36M, about 1.38M, about 1.4M, about 1.42M, about 1.44M, about 1.46M, about 1.48M, about 1.5M, about 1.52M, about 1.54M, about 1.56M, about 1.58M, about 1.6M, about 1.62M, about 1.64M, about 1.66M, about 1.68M, about 1.7M, about 1.72M, about 1.74M, about 1.76M, about 1.78M, about 1.8M, about 1.82M, about 1.84M, about 1.86M, about 1.88M, about 1.9M, about 1.92M, about 1.94M, about 1.96M, about 1.98M, about 2M, or any range including and/or in between any two of the preceding values.

In any embodiment disclosed herein, the electrolyte may also include a redox shuttle. The redox shuttle, if present, will have an electrochemical potential above the positive electrode's maximum normal operating potential. Illustrative redox shuttles include, but are not limited to, a spirocyclic hydrocarbon containing at least one oxygen atom and at least on alkenyl or alkynyl group, pyridazine, vinyl pyridazine, quinolone, pyridine, vinyl pyridine, 2,4-divinyltetrahydrooyran, 3,9-diethylidene-2,4,8-trioxaspiro[5,5]undecane, 2-ethylidene-5-vinyl-[1,3]dioxane, lithium alkyl fluorophosphates, lithium alkyl fluoroborates, lithium 4,5-dicyano-2-(trifluoromethyl)imidazole, lithium 4,5-dicyano-2-methylimidazole, trilithium 2,2',2"-tris(trifluoromethyl)benzotris(imidazolate), $Li(CF_3CO_2)$, $Li(C_2F_5CO_2)$, $LiCF_3SO_3$, $LiCH_3SO_3$, $LiN(SO_2CF_3)_2$, $LiC(CF_3SO_2)_3$, $LiN(SO_2C_2F_5)_2$, $LiClO_4$, $LiAsF_6$, $Li_2(B_{12}X_{12-I}H_I)$, $Li_2(B_{10}X_{10-I'}H_{I'})$, wherein X is independently at each occurrence a halogen, I is an integer from 0 to 12 and I' is an integer from 0 to 10, 1,3,2-dioxathiolane 2,2-dioxide, 4-methyl-1,3,2-dioxathiolane 2,2-dioxide, 4-(trifluoromethyl)-1,3,2-dioxathiolane 2,2-dioxide, 4-fluoro-1,3,2-dioxathiolane 2,2-dioxide, 4,5-difluoro-1,3,2-dioxathiolane 2,2-dioxide, dimethyl sulfate, methyl (2,2,2-trifluoroethyl) sulfate, methyl (trifluoromethyl) sulfate, bis(trifluoromethyl) sulfate, 1,2-oxathiolane 2,2-dioxide, methyl ethanesulfonate, 5-fluoro-1,2-oxathiolane 2,2-dioxide, 5-(trifluoromethyl)-1,2-oxathiolane 2,2-dioxide, 4-fluoro-1,2-oxathiolane 2,2-dioxide, 4-(trifluoromethyl)-1,2-oxathiolane 2,2-dioxide, 3-fluoro-1,2-oxathiolane 2,2-dioxide, 3-(trifluoromethyl)-1,2-oxathiolane 2,2-dioxide, difluoro-1,2-oxathiolane 2,2-dioxide, 5H-1,2-oxathiole 2,2-dioxide, 2,5-dimethyl-1,4-dimethoxybenzene, 2,3,5,6-tetramethyl-1,4-dimethoxybenzene, 2,5-di-tert-butyl-1,4-dimethoxybenzene, or a combination of any two or more thereof, with the proviso that when used, the redox shuttle is not the same as the lithium salt, even though they perform the same function in the cell. That is, for example, if the lithium salt is $LiClO_4$, it may also perform the dual function of being a redox shuttle, however if a redox shuttle is included in that same cell, it will be a different material than $LiClO_4$.

As described, the lithium ion batteries may include a cathode that includes a cathode active material. In some embodiments, the cathode active material may include, but is not limited to, a spinel, an olivine, a carbon-coated olivine, $LiFePO_4$, $LiMn_{0.5}Ni_{0.5}O_2$, $LiCoO_2$, $LiNiO_2$, $LiNi_{1-x}Co_yMe_zO_2$, $LiNi_\alpha Mn_\beta Co_\gamma O_2$, $LiMn_2O_4$, $LiFeO_2$, $LiNi_{0.5}Me_{1.5}O_4$, $Li_{1+x'}Ni_hMn_kCo_lMe^2{}_yO_{2-z'}F_{z'}$, $VO_2$ or $E_{x''}F_2(Me_3O_4)_3$, $LiNi_mMn_nO_4$, wherein Me is Al, Mg, Ti, B, Ga, Si, Mn, or Co; $Me^2$ is Mg, Zn, Al, Ga, B, Zr, or Ti; E is Li, Ag, Cu, Na, Mn, Fe, Co, Ni, or Zn; F is Ti, V, Cr, Fe, or Zr; wherein $0 \le x \le 0.3$; $0 \le y \le 0.5$; $0 \le z \le 0.5$; $0 \le m \le 2$; $0 \le n \le 2$; $0 \le x' \le 0.4$; $0 \le \alpha \le 1$; $0 \le \beta \le 1$; $0 \le \gamma \le 1$; $0 \le h \le 1$; $0 \le k \le 1$; $0 \le l \le 1$; $0 \le y' \le 0.4$; $0 \le z' \le 0.4$; and $0 \le x'' \le 3$; with the proviso that at least one of h, k and l is greater than 0. In some embodiments, the electrically conductive materially may include, but is not limited to, graphite, graphene, expanded graphite, reduced graphene oxide, Black Pearls® 2000, Ketjenblack®, acetylene black, carbon black, a metal-organic framework, porous carbon, carbon spheres, carbon aerogel, single-walled carbon nanotubes, multi-walled carbon nanotubes, carbon nanofibers, carbon nanotube arrays, or a combination of any two or more thereof.

The term "spinel" refers to a manganese-based spinel such as, $Li_{1+x}Mn_{2-y}Me_zO_{4-h}A_k$, wherein Me is Al, Mg, Ti, B, Ga, Si, Ni, or Co; A is S or F; and wherein $0 \le x \le 0.5$, $0 \le y \le 0.5$, $0 \le z \le 0.5$, $0 \le h \le 0.5$, and $0 \le k \le 0.5$.

The term "olivine" refers to an iron-based olivine such as, $LiFe_{1-x}Me_yPO_{4-h}A_k$, wherein Me is Al, Mg, Ti, B, Ga, Si, Ni, or Co; A is S or F; and wherein $0 \le x \le 0.5$, $0 \le y \le 0.5$, $0 \le h \le 0.5$, and $0 \le k \le 0.5$.

In any embodiment disclosed herein, the cathode may be further stabilized by surface coating the active particles with a material that can neutralize acid or otherwise lessen or prevent leaching of the transition metal ions. Hence, the cathodes may also include a surface coating of a metal oxide or a metal fluoride such as $ZrO_2$, $TiO_2$, $ZnO_2$, $WO_3$, $Al_2O_3$, MgO, $SiO_2$, $SnO_2$, $AlPO_4$, $Al(OH)_3$, $AlF_3$, $ZnF_2$, $MgF_2$, $TiF_4$, $ZrF_4$, CaO, $In_2O_3$, $Ga_2O_3$, $Sc_2O_3$, $Y_2O_3$, $La_2O_3$, $HfO_2$, $V_2O_5$, $Nb_2O_5$, $Ta_2O_5$, MnO, $MnO_2$, CoO, $Co_2O_3$, NiO, $NiO_2$, CuO, ZnO, $MgF_2$, $CaF_2$, Mo, Ta, W, Fe, Co, Cu, Ru, Pa, Pt, Al, Si, Se, oxyfluorides, a mixture of any two or more thereof, or any other suitable metal oxide or fluoride. In some embodiments, the coating may be applied to a carbon coated cathode.

In any embodiment disclosed herein, the cathode may be further stabilized by surface coating the active particles with polymer materials. Examples of polymer coating materials include, but are not limited to, polysiloxanes, polyethylene glycol, poly(3,4-ethylenedioxythiophene) polystyrene sulfonate, or a combination of any two or more thereof.

In any embodiment disclosed herein, the electrolyte may further include an electrode stabilizing additive. The electrode stabilizing additive is used to protect the electrodes from degradation. Examples of electrode stabilizing additives may be found in U.S. patent application Ser. Nos. 10/857,365, 11/279,120, and 60/647,361, of which the entire contents are incorporated herein by reference. Hence, the electrode stabilizing additive which may be included herein may be reduced or polymerized on the surface of the negative electrode. Likewise, the electrode stabilizing additive which may be included herein may be oxidized or polymerized on the surface of the positive electrode.

In any embodiment disclosed herein, the electrolyte may include about 0.001 wt % to about 8 wt % of the electrode stabilizing additive. This may include, for example, about 0.001 wt %, about 0.002 wt %, about 0.003 wt %, about 0.004 wt %, about 0.005 wt %, about 0.006 wt %, about 0.007 wt %, about 0.008 wt %, about 0.009 wt %, about 0.01 wt %, about 0.02 wt %, about 0.03 wt %, about 0.04 wt %, about 0.05 wt %, about 0.06 wt %, about 0.07 wt %, about 0.08 wt %, about 0.09 wt %, about 0.1 wt %, about 0.15 wt %, about 0.2 wt %, about 0.25 wt %, about 0.3 wt %, about 0.35 wt %, about 0.4 wt %, about 045 wt %, about 0.5 wt %, about 0.55 wt %, about 0.6 wt %, about 0.65 wt %, about 0.7 wt %, about 0.75 wt %, about 0.8 wt %, about 0.85 wt %, about 0.9 wt %, about 0.95 wt %, about 1 wt %, about 1.1 wt %, about 1.2 wt %, about 1.3 wt %, about 1.4 wt %, about 1.5 wt %, about 1.6 wt %, about 1.7 wt %, about 1.8 wt %, about 1.9 wt %, about 2 wt %, about 2.1 wt %, about 2.2 wt %, about 2.3 wt %, about 2.4 wt %, about 2.5 wt %, about 2.6 wt %, about 2.7 wt %, about 2.8 wt %, about 2.9 wt %, about 3 wt %, about 3.1 wt %, about 3.2 wt %, about 3.3 wt %, about 3.4 wt %, about 3.5 wt %, about 3.6 wt %, about 3.7 wt %, about 3.8 wt %, about 3.9 wt %, about 4 wt %, about 4.1 wt %, about 4.2 wt %, about 4.3 wt %, about 4.4 wt %, about 4.5 wt %, about 4.6 wt %, about 4.7 wt %, about 4.8 wt %, about 4.9 wt %, about 5 wt %, about 5.1 wt %, about 5.2 wt %, about 5.3 wt %, about 5.4 wt %, about 5.5 wt %, about 5.6 wt %, about 5.7 wt %, about 5.8 wt %, about 5.9 wt %, about 6 wt %, about 6.1 wt %, about 6.2 wt %, about 6.3 wt %, about 6.4 wt %, about 6.5 wt %, about 6.6 wt %, about 6.7 wt %, about 6.8 wt %, about 6.9 wt %, about 7 wt %, about 7.1 wt %, about 7.2 wt %, about 7.3 wt %, about 7.4 wt %, about 7.5 wt %, about 7.6 wt %, about 7.7 wt %, about 7.8 wt %, about 7.9 wt %, about 8 wt %, or any range including and/or in between any two of the preceding values, of the electrode stabilizing additive.

In any embodiment disclosed herein, the electrode stabilizing additive may include 1,2-divinyl furoate, 1,3-butadiene carbonate, 1-vinylazetidin-2-one, 1-vinylaziridin-2-one, 1-vinylpiperidin-2-one, 1-vinylpyrrolidin-2-one, 2,4-divinyl-1,3-dioxane, 2-amino-3-vinylcyclohexanone, 2-amino-3-vinylcyclopropanone, 2-amino-4-vinylcyclobutanone, 2-amino-5-vinylcyclopentanone, 2-aryloxy-cyclopropanone, 2-vinyl-[1,2]oxazetidine, 2-vinylaminocyclohexanol, 2-vinylaminocyclopropanone, 2-vinyloxetane, 2-vinyloxy-cyclopropanone, 3-(N-vinylamino)cyclohexanone, 3,5-divinyl furoate, 3-vinylazetidin-2-one, 3-vinylaziridin-2-one, 3-vinylcyclobutanone, 3-vinylcyclopentanone, 3-vinyloxaziridine, 3-vinyloxetane, 3-vinylpyrrolidin-2-one, 4,4-divinyl-3-dioxolan-2-one, 4-vinyltetrahydropyran, 5-vinylpiperidin-3-one, allylglycidyl ether, butadiene monoxide, butyl vinyl ether, dihydropyran-3-one, divinyl butyl carbonate, divinyl carbonate, divinyl crotonate, divinyl ether, divinyl ethylene carbonate, divinyl ethylene silicate, divinyl ethylene sulfate, divinyl ethylene sulfite, divinyl methoxypyrazine, divinyl methylphosphate, divinyl propylene carbonate, ethyl phosphate, methoxy-o-terphenyl, methyl phosphate, oxetan-2-yl-vinylamine, oxiranylvinylamine, vinyl carbonate, vinyl crotonate, vinyl cyclopentanone, vinyl ethyl-2-furoate, vinyl ethylene carbonate, vinyl carbonate, 1,2-diphenyl ether, vinyl ethylene silicate, vinyl ethylene sulfate, vinyl ethylene sulfite, vinyl methacrylate, vinyl phosphate, vinyl-2-furoate, vinylcylopropanone, vinylethylene oxide, or a combination of any two or more thereof. In some embodiments, the electrode stabilizing additive may be vinyl ethylene carbonate, vinyl carbonate, 1,2-diphenyl ether, or a combination of any two or more thereof.

In any embodiment disclosed herein, the electrode stabilizing additive may be a cyclotriphosphazene that is substituted with F, alkyloxy, alkenyloxy, aryloxy, methoxy, allyloxy groups, or a combination of any two or more thereof. Illustrative electrode stabilizing additives may include, but are not limited to (divinyl)-(methoxy)(trifluoro)cyclotriphosphazene, (trivinyl)(difluoro)(methoxy)cyclotriphosphazene, (vinyl)(methoxy)(tetrafluoro)cyclotriphosphazene, (aryloxy)(tetrafluoro)(methoxy)-cyclotriphosphazene, (diaryloxy)(trifluoro)(methoxy)cyclotriphosphazene, or a combination of any two or more thereof.

In any embodiment disclosed herein, the electrode stabilizing additive may include compounds with phenyl, naphthyl, anthracenyl, pyrrolyl, oxazolyl, furanyl, indolyl, carbazolyl, imidazolyl, or thiophenyl groups. Illustrative electrode stabilizing additives may include, but are not limited to, aryloxy pyrrole, aryloxy ethylene sulfate, aryloxy pyrazine, aryloxy-carbazole trivinylphosphate, aryloxy-ethyl-2-furoate, aryloxy-o-terphenyl, aryloxy-pyridazine, butyl-aryloxy-ether, divinyl diphenyl ether, (tetrahydrofuran-2-yl)-vinylamine, divinyl methoxybipyridine, methoxy-4-vinylbiphenyl, vinyl methoxy carbazole, vinyl methoxy piperidine, vinyl methoxypyrazine, vinyl methyl carbonate-allylanisole, vinyl pyridazine, 1-divinylimidazole, 3-vinyltetrahydrofuran, divinyl furan, divinyl methoxy furan, divinylpyrazine, vinyl methoxy imidazole, vinyl-methoxy pyrrole, vinyl-tetrahydrofuran, 2,4-divinyl isooxazole, 3,4-divinyl-1-methyl pyrrole, aryloxyoxetane, aryloxy-phenyl carbonate, aryloxy-piperidine, aryloxy-tetrahydrofuran, 2-aryl-cyclopropanone, 2-diaryloxy-furoate, 4-allylanisole, aryloxy-carbazole, aryloxy-2-furoate, aryloxy-crotonate, aryloxy-cyclobutane, aryloxy-cyclopentanone, aryloxy-cyclopropanone, aryloxy-cycolophosphazene, aryloxy-ethylene silicate, aryloxy-ethylene sulfate, aryloxy-ethylene sulfite, aryloxy-imidazole, aryloxy-methacrylate, aryloxy-phosphate, aryloxy-pyrrole, aryloxy-quinoline, diaryloxy-cyclotriphosphazene, diaryloxy ethylene carbonate, diaryloxy furan, diaryloxy methyl phosphate, diaryloxy-butyl carbonate, diaryloxy-crotonate, diaryloxy-diphenyl ether, diaryloxy-ethyl silicate, diaryloxy-ethylene silicate, diaryloxy-ethylene sulfate, diaryloxyethylene sulfite, diaryloxy-phenyl carbonate, diaryloxy-propylene carbonate, diphenyl carbonate, diphenyl diaryloxy silicate, diphenyl divinyl silicate, diphenyl ether, diphenyl silicate, divinyl methoxydiphenyl ether, divinyl phenyl carbonate, methoxycarbazole, or 2,4-dimethyl-6-hydroxy-pyrimidine, vinyl methoxyquinoline, pyridazine, vinyl pyridazine, quinoline, vinyl quinoline, pyridine, vinyl pyridine, indole, vinyl indole, triethanolamine, 1,3-dimethyl butadiene, butadiene, vinyl ethylene carbonate, vinyl carbonate, imidazole, vinyl imidazole, piperidine, vinyl piperidine, pyrimidine, vinyl pyrimidine, pyrazine, vinyl pyrazine, isoquinoline, vinyl isoquinoline, quinoxaline, vinyl quinoxaline, biphenyl, 1,2-diphenyl ether, 1,2-diphenylethane, o terphenyl, N-methyl pyrrole, naphthalene, or a combination of any two or more thereof.

In any embodiment disclosed herein, the electrode stabilizing additives may include substituted or unsubstituted spirocyclic hydrocarbons which may contain at least one oxygen atom and at least one alkenyl or alkynyl group. Illustrative electrode stabilizing additives include, but are not limited to, a compound represented by the Formula X:

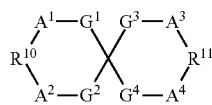

X wherein $A^1$, $A^2$, $A^3$, and $A^4$ are independently at each occurrence O or $CR^{12}R^{13}$; provided that $A^1$ is not O when $G^1$ is O, $A^2$ is not O when $G^2$ is O, $A^3$ is not O when $G^3$ is O, and $A^4$ is not O when $G^4$ is O; $G^1$, $G^2$, $G^3$, and $G^4$ are independently at each occurrence O or $CR^{12}R^{13}$; provided that $G^1$ is not O when $A^1$ is O, $G^2$ is not O when $A^2$ is O, $G^3$ is not O when $A^3$ is O, and $G^4$ is not O when $A^4$ is O; $R^{10}$ and $R^{11}$ are independently at each occurrence a substituted or unsubstituted divalent alkenyl or alkynyl group; and $R^{12}$ and $R^{13}$ are independently at each occurrence H, F, Cl, or a substituted or an unsubstituted alkyl, alkenyl, or alkynyl group.

Illustrative compounds of Formula X include, but are not limited to, 3,9 divinyl-2,4,8,10-tetraoxaspiro[5.5]undecane, 3,9-divinyl-2,4,8-trioxaspiro[5.5]undecane, 3,9-divinyl-2,4-dioxaspiro[5.5]undecane, 3,9-diethylidene-2,4,8,10-tetraoxaspiro[5.5]undecane, 3,9 diethylidene-2,4,8-trioxaspiro[5.5]undecane, 3,9-diethylidene-2,4-dioxaspiro[5.5]undecane, 3,9-dimethylene-2,4,8,10-tetraoxaspiro[5.5]undecane, 3,9-divinyl-1,5,7,11-tetraoxaspiro[5.5]undecane, 3,9 dimethylene-1,5,7,11-tetraoxaspiro[5.5]undecane, 3,9 diethylidene-1,5,7,11-tetraoxaspiro[5.5]undecane, or a combination of any two or more thereof.

In any embodiment disclosed herein, the electrode stabilizing additive may be an anion receptor. In some embodiments, the anion receptor is a Lewis acid. In some embodiments, the anion receptor is a borane, a boronate, a borate, a borole, or a combination of any two or more thereof. Illustrative anion receptors include, but are not limited to, a compound represented by the Formula XI:

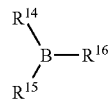

XI wherein $R^{14}$, $R^{15}$, and $R^{16}$ are independently at each occurrence halogen, alkyl, aryl, halogen-substituted alkyl, halogen-substituted aryl, or $OR^{17}$; or any two of $R^{14}$, $R^{15}$, $R^{16}$, and $R^{17}$, together with the atoms to which they are attached, form a heterocyclic ring having 5-9 members, and $R^{17}$ is independently at each occurrence alkyl, aryl, halogen-substituted alkyl, or halogen-substituted aryl. In some embodiments, $R^{14}$, $R^{15}$, and $R^{16}$ are independently at each occurrence halogen, alkyl, aryl, halogen-substituted alkyl, or halogen-substituted aryl; or any two of $R^{14}$, $R^{15}$, and $R^{16}$ together with the atoms to which they are attached, form a heterocyclic ring having 5-9 members.

In any embodiment disclosed herein, the anion receptor may be tri(propyl)borate, tris(1,1,1,3,3,3-hexafluoro-propan-2-yl)borate, tris(1,1,1,3,3,3-hexafluoro-2-phenyl-propan-2-yl)borate, tris(1,1,1,3,3,3-hexafluoro-2-(trifluoromethyl)propan-2-yl)borate, triphenyl borate, tris(4-fluorophenyl)borate, tris(2,4-difluorophenyl)borate, tris(2,3,5,6-tetrafluorophenyl)borate, tris(pentafluorophenyl)borate, tris(3-(trifluoromethyl)phenyl)borate, tris(3,5-bis(trifluoromethyl)phenyl)borate, tris(pentafluorophenyl)borane, or a combination of any two or more thereof. In some embodiments, the anion receptor may be one or more of 2-(2,4-difluorophenyl)-4-fluoro-1,3,2-benzodioxaborole, 2-(3-trifluoromethyl phenyl)-4-fluoro-1,3,2-benzodioxaborole, 2,5-bis(trifluoromethyl)phenyl-4-fluoro-1,3,2-benzodioxaborole, 2-(4-fluorophenyl)-tetrafluoro-1,3,2-benzodioxaborole, 2-(2,4-difluorophenyl)-tetrafluoro-1,3,2-benzodioxaborole, 2-(pentafluorophenyl)-tetrafluoro-1,3,2- benzodioxaborole, 2-(2-trifluoromethyl phenyl)-tetrafluoro-1,3,2-benzodioxaborole, 2,5-bis(trifluoromethyl phenyl)-tetrafluoro-1,3,2-benzodioxaborole, 2-phenyl-4,4,5,5-tetra(trifluoromethyl)-1,3,2-benzodioxaborolane, 2-(3,5-difluorophenyl-4,4,5,5-tetrakis(trifluoromethyl)-1,3,2-dioxaborolane, 2-(3,5-difluorophenyl-4,4,5,5-tetrakis(trifluoromethyl)-1,3,2-dioxaborolane, 2-pentafluorophenyl-4,4,5,5-tetrakis(trifluoromethyl)-1,3,2-dioxaborolane, bis(1,1,1,3,3,3-hexafluoroisopropyl)phenylboronate, bis(1,1,1,3,3,3-hexafluoroisopropyl)-3, 5-difluorophenylboronate, bis(1,1,1,3,3,3-hexafluoroisopropyl) pentafluorophenylboronate, or a mixture of any two or more such compounds.

In any embodiment disclosed herein, the lithium ion batteries may further include a porous separator. The porous separator may separate the cathode from the anode and prevent, or at least minimize, short-circuiting in the device. The separator may be a polymer or ceramic or a mixed separator. The separator may include, but is not limited to, polypropylene (PP), polyethylene (PE), trilayer (PP/PE/PP), or polymer films that may optionally be coated with alumina-based ceramic particles.

Also disclosed herein are methods for making the anode of the present technology. In one aspect, the present disclosure provides a method for making an anode for a lithium ion battery, the method including providing a current collector, and depositing alternating layers of an anode active material and an anode inactive material to form a superlattice; wherein the superlattice is disposed on at least a portion of the current collector.

In any embodiment disclosed herein, the superlattice may be deposited using a physical vapor deposition method. In some embodiments, the physical vapor deposition method may include magnetron sputtering or electron beam evaporation. In some embodiments, the physical vapor deposition method may include magnetron sputtering.

In the methods described herein, the methods may include mounting a current collector on a rotating table to receive deposited material via sputtering. Thus, the physical vapor deposition method may have the current collector configured to be disposed on a rotating table. In some embodiments, the current collector may be provided as a substrate on the rotating table. In some embodiments, the rotating table may be a planetary turn table. In some embodiments, the planetary turn table may be configured to provide substrate rotation. In some embodiments, substrate rotation may provide 2-fold, 3-fold, 4-fold, 5-fold, or 6-fold rotation. In some embodiments, substrate rotation may provide 2-fold rotation. In some embodiments, substrate rotation may provide 3-fold rotation.

In any embodiment disclosed herein, the substrate may be cleaned via argon etching prior to deposition. In some embodiments, BIAS is applied to the substrate to increase the adhesion of the film to the substrate and/or to increase the density of the microstructures.

In any embodiment disclosed herein, the physical vapor deposition method includes at least one target for the anode active material. In some embodiments, the physical vapor deposition method includes at least two targets for the anode active material. In other embodiments, the physical vapor deposition method includes at least three targets for the anode active material. In further embodiments, the physical vapor deposition method includes at least four targets for the anode active material. In some embodiments, the physical vapor deposition method includes at least five targets for the anode active material. In some embodiments, the physical vapor deposition method includes at least six targets for the anode active material.

In any embodiment disclosed herein, the physical vapor deposition method includes at least one target for the anode inactive material. In some embodiments, the physical vapor deposition method includes at least two targets for the anode inactive material. In some embodiments, the physical vapor deposition method includes at least three targets for the anode inactive material. In some embodiments, the physical vapor deposition method includes at least four targets for the anode inactive material. In some embodiments, the physical vapor deposition method includes at least five targets for the anode inactive material. In some embodiments, the physical vapor deposition method includes at least six targets for the anode inactive material.

In any embodiment disclosed herein, the alternating layers of the anode active material and the anode inactive material may be deposited discontinuously to form a plurality of channels. The plurality of channels extends from the current collector through the alternating layers of anode active material and anode inactive material. In some embodiments, a plurality of channels may be cut and/or etched into the superlattice after forming the superlattice on the current collector. The plurality of channels extends from the current collector through the alternating layers of anode active material and anode inactive material.

EXAMPLES

The present technology is further illustrated by the following Example, which should not be construed as limiting in any way. The examples herein are provided to illustrate advantages of the present technology and to further assist a person of ordinary skill in the art with preparing or using the compositions and systems of the present technology. The examples should in no way be construed as limiting the scope of the present technology, as defined by the appended claims. The examples can include or incorporate any of the variations, aspects, or embodiments of the present technology described above. The variations, aspects, or embodiments described above may also further each include or incorporate the variations of any or all other variations, aspects or embodiments of the present technology.

Example 1

Figure 2:
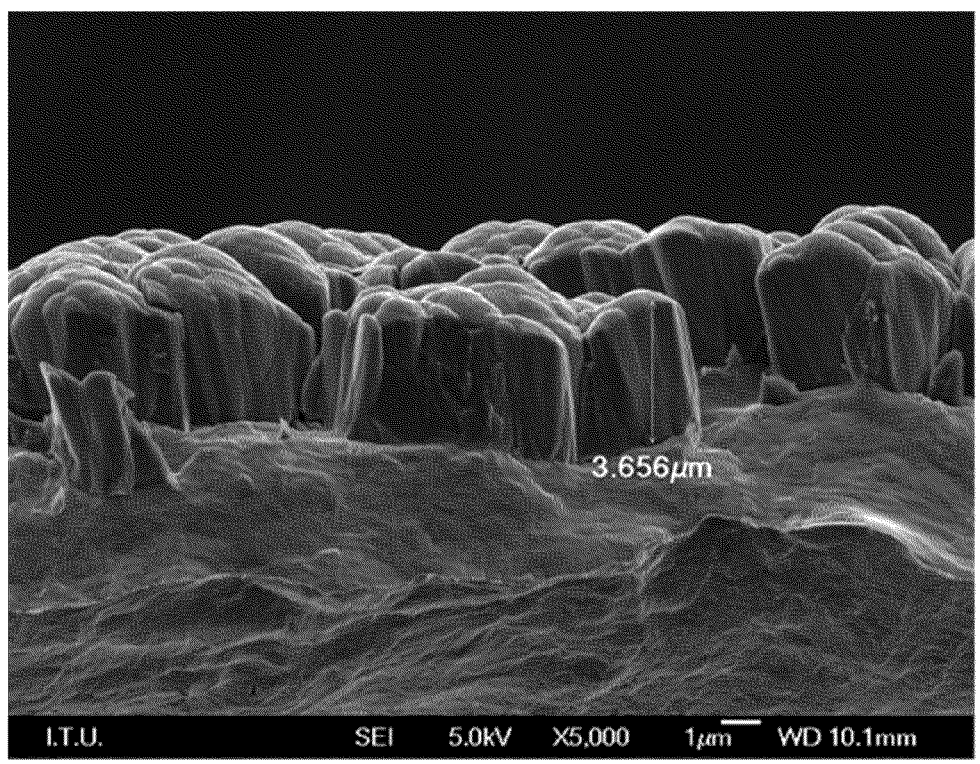
FIG. 2 is a scanning electron microscope (SEM) image of a SiCuMo sample showing the morphology of a nanorod array.

A superlattice, nanostructured SiCuMo electrode was prepared by physical vapor deposition, specifically via magnetron sputtering. Prior to deposition, substrates were located on a substrate tower in a planetary turn table wherein the gear ratio is 100:37. High purity and Cu—Mo targets were used for the preparation of the anode. The samples were rotated on a planetary holder system to increase the interaction among the Cu—Si—Mo atoms. The planetary turn table provides two-fold rotation with the main turntable rotating at a speed of 10 rpm (anti-clock wise) with 6 satellites. Prior to deposition, the samples were cleaned with acetone and isopropyl alcohol. The deposition chamber was then pumped down to a pressure less than 10-5 Pa. To enhance film adhesion, argon etching was applied to the substrate at 550 V bipolar pulsed with 250 kHz frequency and 1600 ns reverse time. After substrate cleaning, 500 W and 2000 W were applied to Cu-Mo and Si targets, respectively for 150 min at -100 V bias for the deposition. Magnetron sputtering occurred without mechanical shielding/shuttering or gas flow. To sputter the Cu—Mo and Si targets, direct current (DC) and high-power impulse magnetron sputtering (HPPMS) power supplies were used respectively and independently. As shown in FIG. 2, the small gaps provided between the domains may serve as the channels for the non-aqueous electrolyte to diffuse in and provide a pathway for lithium ions to access the layers of active material.

Example 2

Figure 3:
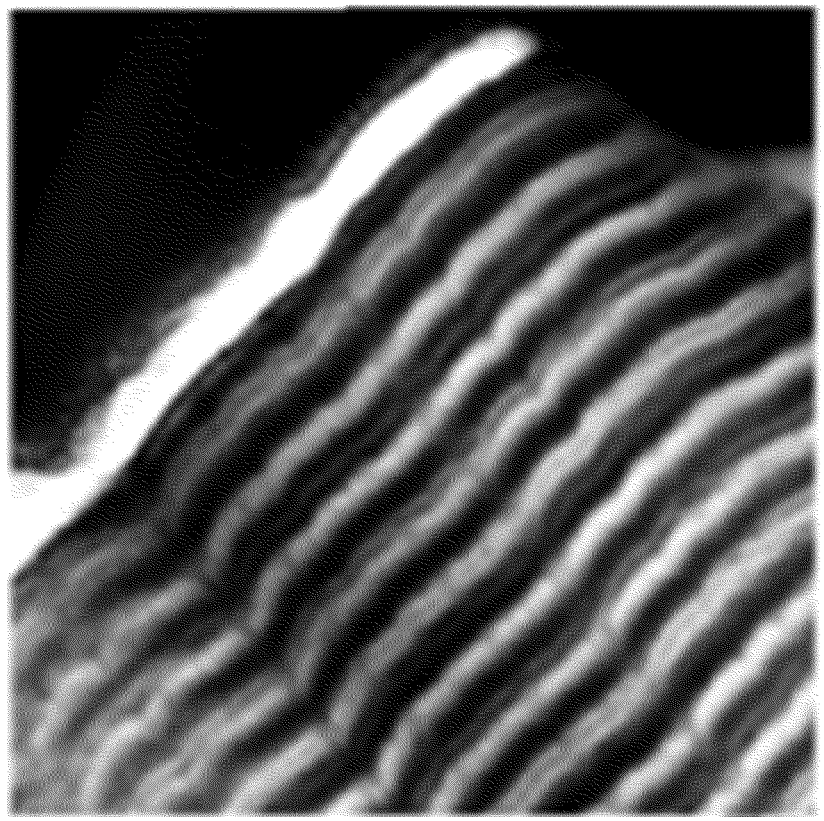
FIG. 3 is an energy-dispersive x-ray spectroscopy (EDS) mapping of a patterned SiCuMo sample, illustrating the layer by layer structure.
Figure 5:
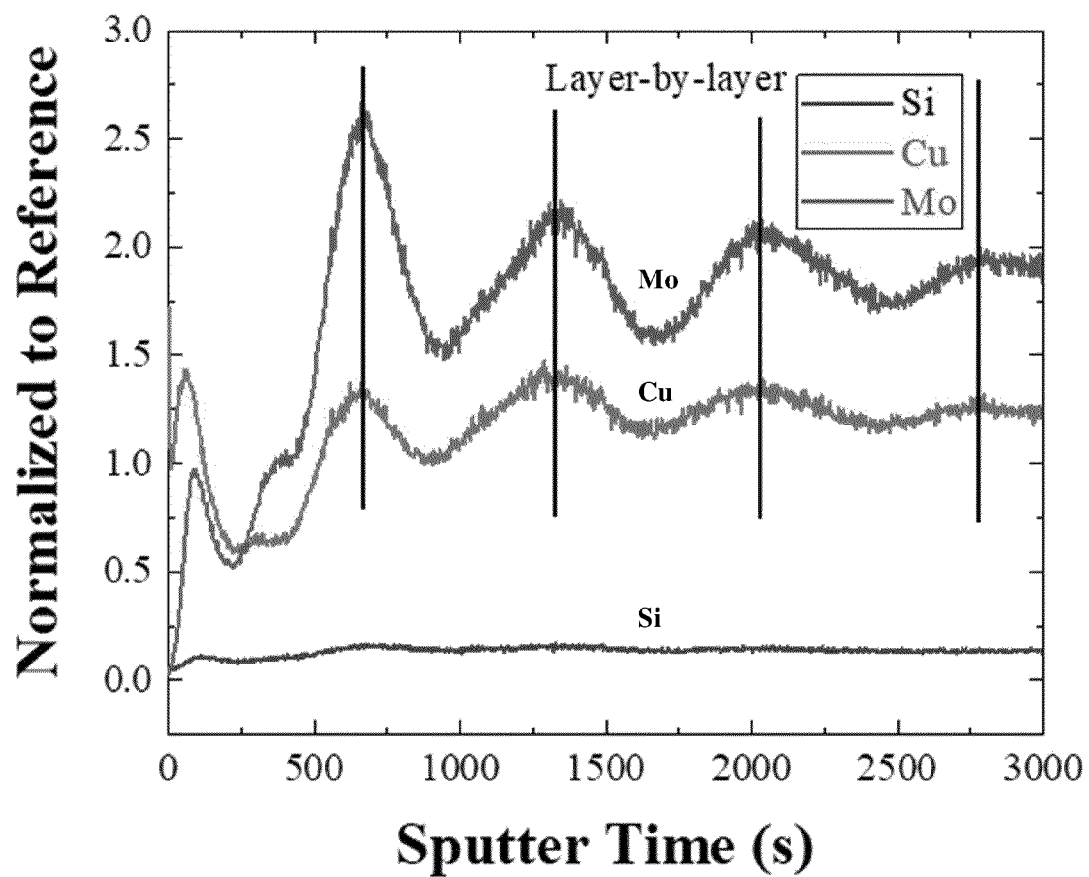
FIG. 5 illustrates Nano Secondary Ion Mass Spectrometry (NanoSims) data showing the concentration variation of both Cu and Mo in a SiCuMo sample to illustrate the layer-by-layer structure.

FIG. 3 shows the energy-dispersive x-ray spectroscopy (EDS) elemental mapping of the superlattice, nanostructured SiCuMo electrode. The bright area in FIG. 3 shows the presence of heavy elements (Cu and Mo) and the dark area shows the presence of light elements (Si). The results illustrate the presence of a layer-by-layer structure. Further details on elemental distribution was determined via Nano Secondary Ion Mass Spectrometry (NanoSims) experiments (FIG. 5). The data demonstrate homogenous distribution of Si along the thickness of the thin film. However, the data clearly demonstrate concentration attenuation for both Cu and Mo along the thickness of the thin film. Accordingly, the data from the both the EDS and nano-SIM experiments confirm the layer-by-layer structure design principle.

Example 4

Figure 4:
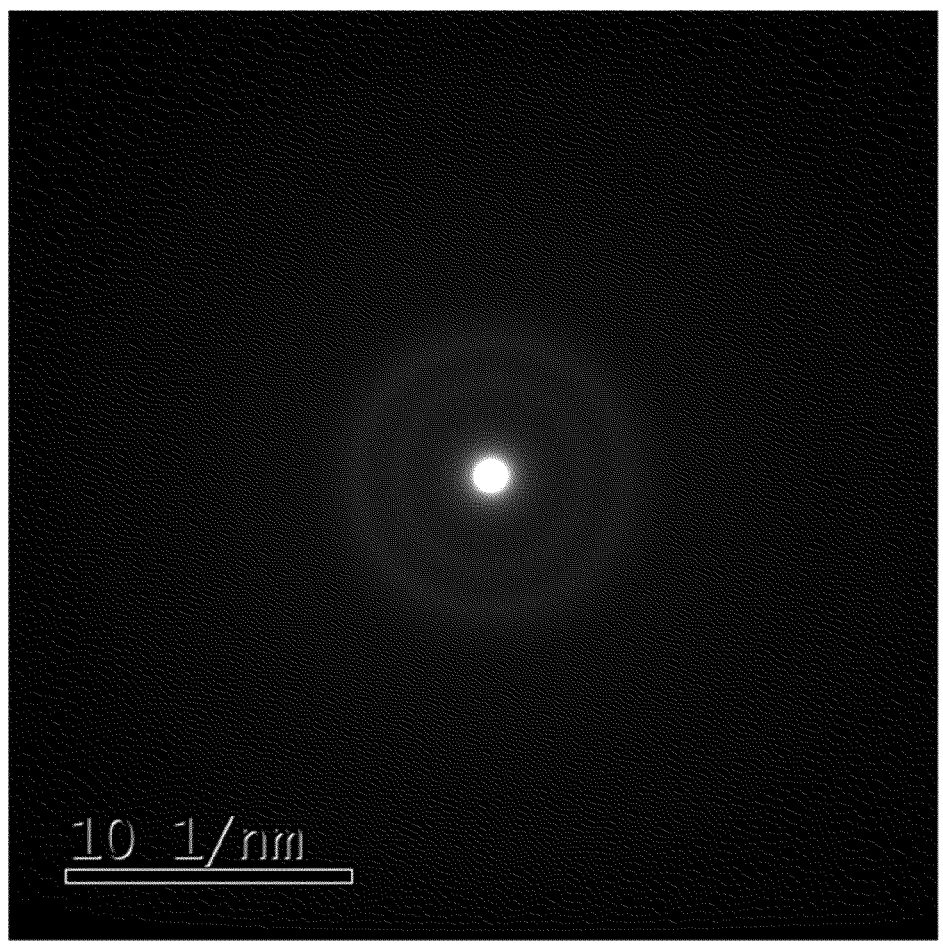
FIG. 4 illustrates electron diffraction patterns of a patterned SiCuMo sample, illustrating the amorphous nature of the sample.

FIG. 4 shows electron diffraction patterns of the superlattice, nanostructured SiCuMo electrode. The data demonstrates the amorphous structure of the thin film, which decreases the destructive effect of the internal stresses in the electrode upon cycling.

Example 5

Figure 6:
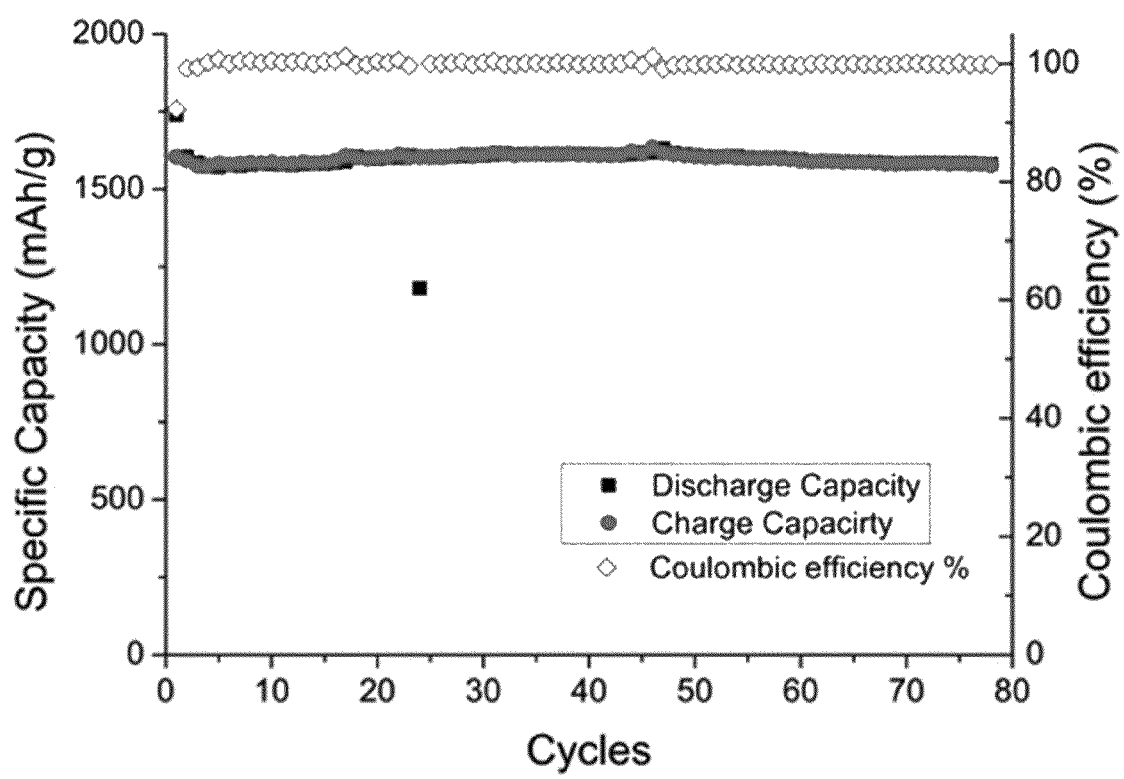
FIG. 6 illustrates a graph of charge and discharge capacity versus cycle number of LiI SiCuMo cell, demonstrating a highly reversible capacity and an excellent capacity retention.

FIG. 6 shows the charge/discharge capacity of a Li/SiCuMo electrochemical cell during cycling with a constant current of C/10. The anode is a superlattice nanostructured SiCuMo electrode that has a total thickness of 3.6 µm. The electrolyte used in this study was $LiPF_6$ (1.0 M) in an ethylene carbonate (EC)-dimethyl carbonate (DMC) (1:1) electrolyte solution with 10% fluoroethylene carbonate (FEC). As illustrated in FIG. 6, the electrochemical cell delivers an initial discharge capacity of about 1750 mAh/g, and an initial charge capacity of about 1650 mAh/g. The initial irreversible capacity loss was about 5%, which is substantially smaller than the traditional Si-based intermetallic alloys. The latter value being sustained for more than 50 cycles.

The present technology is not to be limited in terms of the particular embodiments described in this application, which are intended as single illustrations of individual aspects of the present technology. Many modifications and variations of this present technology can be made without departing from its spirit and scope, as will be apparent to those skilled in the art. Functionally equivalent methods and apparatuses within the scope of the present technology, in addition to those enumerated herein, will be apparent to those skilled in the art from the foregoing descriptions. Such modifications and variations are intended to fall within the scope of the present technology. It is to be understood that this present technology is not limited to particular methods, reagents, compounds, compositions, or biological systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member. Thus, for example, a group having 1-3 atoms refers to groups having 1, 2, or 3 atoms. Similarly, a group having 1-5 atoms refers to groups having 1, 2, 3, 4, or 5 atoms, and so forth.

All patents, patent applications, provisional applications, and publications referred to or cited herein are incorporated by reference in their entirety, including all figures and tables, to the extent they are not inconsistent with the explicit teachings of this specification.

What is claimed is:

1. An anode for a lithium ion battery, the anode comprising:
   a current collector; and
   a superlattice disposed on at least a portion of the current collector, the superlattice comprising:
      alternating and parallel layers of an anode active material and an anode inactive material; and
      a plurality of channels that extend from the current collector through the superlattice, the channels having been formed in the alternating layers of the anode active material and the anode inactive material;
   wherein the anode inactive material is an intermetallic material of any two or more selected from the group consisting of Cu, Mo, Bi, Ni, Fe, Ti, V, C, Mn, Co, Ni, Tc, Ru, Rh, Ag, Au, Pd, W, Y, Sc, Zr, Nb, Hf, Ta, and an oxide thereof.

2. The anode for a lithium ion battery of claim 1, wherein the current collector comprises copper, stainless steel, titanium, tantalum, platinum, gold, aluminum, nickel, cobalt, cobalt nickel alloy, highly alloyed ferritic stainless steel containing molybdenum and chromium, a nickel-containing alloy, a chromium-containing alloy, or a molybdenum-containing alloy.

3. The anode for a lithium ion battery of claim 1, wherein the current collector comprises a foil.

4. The anode for a lithium ion battery of claim 1, wherein the superlattice has a thickness of about 5 nm to about 5 µm.

5. The anode for a lithium ion battery of claim 1, wherein each of the plurality of alternating layers of the anode active material and the anode inactive material individually has a thickness of about 0.1 nm to about 150 nm.

6. The anode for a lithium ion battery of claim 1, wherein the anode active material is selected from the group consisting of Si, Zn, Sn, As, Sb, P, Cd, In, Mg, Ge, Al, S, Na, K, C, an oxide thereof, and a combination of any two or more thereof.

7. The anode for a lithium ion battery of claim 6, wherein the anode active material is Si.

8. The anode for a lithium ion battery of claim 1, wherein the superlattice comprises about 5 wt % to about 95 wt % anode active material.

9. The anode for a lithium ion battery of claim 1, wherein the plurality of alternating layers of an anode active material comprises a nanocrystalline structure.

10. The anode for a lithium ion battery of claim 1, wherein the plurality of alternating layers of an anode active material comprises an amorphous structure.

11. The anode for a lithium ion battery of claim 1, wherein the anode inactive material is selected from the group consisting of Cu, Mo, Ni, Fe, Ti, V, C, Mn, Co, Ni, Ru, Rh, Au, Pd, W, Y, Sc, Zr, Nb, Hf, Ta, an oxide thereof, and a combination of any two or more thereof.

12. The anode for a lithium ion battery of claim 1, wherein the intermetallic material is CuMo.

13. The anode for a lithium ion battery of claim 1, wherein the superlattice comprises about 95 wt % to about 5 wt % anode inactive material.

14. The anode for a lithium ion battery of claim 1, wherein the plurality of channels comprises a width of about 0.1 nm to about 10 nm.

15. The anode for a lithium ion battery of claim 1, wherein the plurality of channels allow diffusion of a non-aqueous electrolyte.

16. The anode for a lithium ion battery of claim 1, wherein the anode inactive material is an intermetallic material of any two or more selected from the group consisting of Cu, Mo, Ni, Fe, Ti, V, C, Mn, Co, Ni, Tc, Ru, Rh, Au, Pd, W, Y, Sc, Zr, Nb, Hf, Ta, and an oxide thereof.

17. A method for making an anode for a lithium ion battery, the method comprising:
provid ing a current collector; and
depositing alternating and parallel layers of an anode active material and an anode inactive material and forming channels in the alternating and parallel layers after or during the depositing of the alternating layers to form a superlattice;
wherein:
the anode inactive material comprises an intermetallic material having any two or more selected from the group consisting of Cu, Mo, Bi, Ni, Fe, Ti, V, C, Mn, Co, Ni, Tc, Ru, Rh, Ag, Au, Pd, W, Y, Sc, Zr, Nb, Hf, Ta, and an oxide thereof; and
the superlattice is disposed on at least a portion of the current collector.

18. The method of claim 17, wherein the superlattice is deposited using a physical vapor deposition method.

19. The method of claim 18, wherein the physical vapor deposition method comprises magnetron sputtering or electron beam evaporation.

20. The method of claim 17, wherein the anode inactive material is an intermetallic material of any two or more selected from the group consisting of Cu, Mo, Ni, Fe, Ti, V, C, Mn, Co, Ni, Tc, Ru, Rh, Au, Pd, W, Y, Sc, Zr, Nb, Hf, Ta, and an oxide thereof.

21. A lithium ion battery comprising:
a non-aqueous electrolyte;
a cathode; and
an anode comprising:
a current collector; and
a superlattice disposed on at least a portion of the current collector, the superlattice comprising:
alternating, parallel layers of an anode active material and an anode inactive material; and
a plurality of channels formed into and extending that extend from the current collector through the alternating layers of anode active material and anode inactive material;
wherein the anode inactive material comprises an intermetallic material having any two or more selected from the group consisting of Cu, Mo, Ni, Fe, Ti, V, C, Mn, Co, Ni, Tc, Ru, Rh, Au, Pd, W, Y, Sc, Zr, Nb, Hf, Ta, and an oxide thereof.

22. The lithium ion battery of claim 21, wherein the anode inactive material is an intermetallic material of any two or more selected from the group consisting of Cu, Mo, Ni, Fe, Ti, V, C, Mn, Co, Ni, Ru, Rh, Au, Pd, W, Y, Sc, Zr, Nb, Hf, Ta, and an oxide thereof.

* * * * *